United States Patent
Riekki et al.

(10) Patent No.: US 8,294,515 B1
(45) Date of Patent: Oct. 23, 2012

(54) AMPLIFIER

(75) Inventors: Jonne Juhani Riekki, Espoo (FI); Jari Johannes Heikkinen, Espoo (FI); Jouni Kristian Kaukovuori, Vantaa (FI)

(73) Assignee: Renesas Mobile Corporation, Tokyo (JP)

( * ) Notice: Subject to any disclaimer, the term of this patent is extended or adjusted under 35 U.S.C. 154(b) by 0 days.

(21) Appl. No.: 13/556,552

(22) Filed: Jul. 24, 2012

Related U.S. Application Data

(63) Continuation of application No. 13/271,705, filed on Oct. 12, 2011, which is a continuation-in-part of application No. 13/111,423, filed on May 19, 2011.

(51) Int. Cl.
*H03F 1/14* (2006.01)
(52) U.S. Cl. ............................ 330/51; 330/283; 330/311
(58) Field of Classification Search ................ 330/51, 330/252, 253, 277, 283, 311
See application file for complete search history.

(56) References Cited

U.S. PATENT DOCUMENTS

| | | | |
|---|---|---|---|
| 6,094,084 A | 7/2000 | Abou-Allam et al. | |
| 6,175,274 B1 | 1/2001 | Groe | |
| 6,933,779 B2 | 8/2005 | Lee et al. | |
| 6,949,979 B2 | 9/2005 | Lu et al. | |
| 7,084,707 B2 | 8/2006 | Razavi et al. | |
| 7,266,360 B2 | 9/2007 | Kang et al. | |
| 7,323,939 B2 * | 1/2008 | Han et al. ...................... | 330/311 |
| 7,474,158 B1 | 1/2009 | Yim et al. | |
| 7,495,515 B1 | 2/2009 | Branch et al. | |
| 7,595,693 B2 | 9/2009 | Wiklund | |
| 7,622,989 B2 | 11/2009 | Tzeng et al. | |
| 7,633,345 B2 | 12/2009 | Zhan | |
| 7,656,229 B2 | 2/2010 | Deng et al. | |
| 7,679,436 B2 * | 3/2010 | Jimenez et al. ............... | 330/253 |
| 7,843,270 B2 | 11/2010 | Li et al. | |
| 2005/0068106 A1 | 3/2005 | Irvine | |
| 2006/0132242 A1* | 6/2006 | Han et al. ...................... | 330/311 |
| 2010/0237947 A1 | 9/2010 | Xiong et al. | |
| 2010/0321113 A1 | 12/2010 | Kathiresan et al. | |
| 2010/0328542 A1* | 12/2010 | Kammula et al. ............. | 330/253 |
| 2011/0003563 A1 | 1/2011 | Gorbachov | |

FOREIGN PATENT DOCUMENTS

| | | |
|---|---|---|
| CN | 101834576 A | 9/2010 |
| CN | 101951229 | 1/2011 |
| CN | 101951229 A | 1/2011 |
| EP | 1 993 201 A1 | 11/2008 |

(Continued)

OTHER PUBLICATIONS

Shaeffer, D.K., et al. "A 1.5-V, 1.5-GHz CMOS Low Noise Amplifier," © 1997 IEEE, pp. 745-759.

(Continued)

*Primary Examiner* — Khanh V Nguyen
(74) *Attorney, Agent, or Firm* — Robert P. Michal, Esq.; Lucas & Mercanti, LLP

(57) ABSTRACT

A configurable low noise amplifier circuit which is configurable between a first topology in which the low noise amplifier circuit comprises a degeneration inductance stage whereby the low noise amplifier circuit operates as an inductively degenerated low noise amplifier, and a second topology in which the low noise amplifier circuit comprises a common-gate low noise amplifier stage whereby the low noise amplifier circuit operates as a common-gate low noise amplifier. The second topology comprises one or more internal input impedance matching components and the first topology does not comprise the one or more internal input impedance matching components.

19 Claims, 9 Drawing Sheets

FOREIGN PATENT DOCUMENTS

| | | |
|---|---|---|
| JP | 2010087954 A | 4/2010 |
| KR | 10-1019716 B1 | 7/2010 |
| KR | 2010-0077726 A | 7/2010 |
| KR | 20100077726 A | 7/2010 |
| WO | WO 2007/085866 A1 | 8/2007 |

OTHER PUBLICATIONS

Liao, C-.F., et al., "A Broadband Noise-Canceling CMOS LNA for 3.1-10.6 GHz UWB Receivers," © 2007 IEEE, pp. 329-339.

Darabi, H., et al., A 4.5-mW 900-MHz CMOS Reciever for Wireless Paging, © 2000 IEEE, pp. 1085-1096.

Bruccoleri, et al., "Wide-Band CMOS Low-Noise Amplifier Exploiting Thermal Noise Cancelling", IEEE Journal of Solid-State Circuits, vol. 39, No. 2, Feb. 2004, pp. 275-282.

UKIPO Combined Search and Examination Report under Sections 17 and 18(3) issued for corresponding GB Patent Application No. GB1117607.0 mailed Jan. 27, 2012.

UKIPO Combined Search and Examination Report under Sections 17 and 18(3) issued for corresponding GB Patent Application No. GB1117608.8 mailed Feb. 8, 2012.

Communication (Patents Act of 1977: Entitlement to earlier date under Section 15(9) dated Aug. 20, 2012, issued by the U.K. Patent Office in related U.K. Application GB1207237.7 (2 pages).

Che-Sheng Chen, et al., A 2.5GHz 90nm CMOS Triple Gain Mode LNA for WiMAX Applications, "International Symposium on Signals, Systems and Electronics, " ISSSE' 07, pp. 367-369 (3 pages).

* cited by examiner

FIG. 4 — Prior Art

AMPLIFIER

CROSS-REFERENCE TO RELATED APPLICATIONS

This is a Continuation of U.S. patent application Ser. No. 13/271,705, filed Oct. 12, 2011, and claims the benefit under 35 U.S.C, 119 of GB 1117608.8, filed Oct. 12, 2011, and GB 1108444.9, filed May 19, 2011, the entire disclosure of each of which is incorporated herein by reference. U.S. patent application Ser. No. 13/271,705 is a continuation-in-part of U.S. patent application Ser. No. 13/111,423, filed May 19, 2011, and also claims the benefit under 35 U.S.C. 119 of GB 1108444.9, filed May 19, 2011, the entire disclosure of each of which is incorporation herein by reference.

FIELD OF THE INVENTION

This invention relates to low noise amplifiers. In particular, but not exclusively, this invention relates to configurable low noise amplifier circuits.

BACKGROUND OF THE INVENTION

Radio frequency receivers can be configured to operate within a number of different radio frequency bands. For example a receiver for a mobile station (or cellular telephony device) can be configured to operate within any of the following bands: Global System for Mobile Communications (GSM), 850, 900, 1800, and/or 1900, Wideband Code Division Multiple Access (WCDMA), High Speed Packet Access (HSPA) and/or Long Term Evolution (LTE) Bands 1, 2, 3, etc. This allows a mobile station containing such a receiver to be used in different areas where varying subsets of the above radio frequency hands are supported (e.g. to enable roaming).

Receivers typically incorporate one or more Radio-Frequency Integrated Circuits (RFICs) including a Low Noise Amplifier (LNA) as the first amplifying stage in the receiver. For example, one or more LNAs are typically used to amplify the radio frequency signals gathered by an antenna, and the amplified signals generated by the LNA(s) are then used by other components in the receiver.

Receivers typically include one or more radio frequency (RF) filters located between the antenna and the LNA(s) that form the first amplifying stage of the receiver. FIG. 1 illustrates an exemplary receiver comprising an RF module 100 and antenna 130. RF module 100 comprises an RF Front End Module 132 which in turn includes one or more (up to a total of n) RF filters 110-112 that filter radio frequency signals gathered by antenna 130. RF module 100 also comprises an RFIC 134 which in turn comprises one or more (up to a total of m) LNAs 120-122 that amplify the filtered signals generated by the RF filters 110-112.

As is known from Friis' formula for noise factor, the LNA that forms the first amplifying stage of a receiver dominates the noise figure of the receiver. The LNA that forms the first stage also has a key role in determining the input impedance of the receiver. The input impedance of this LNA must be carefully matched to a certain impedance, as otherwise the performance of an RF filter (e.g. 110-112) preceding the LNA will be degraded. Additionally, an RF filter preceding the LNA will typically have a fixed frequency range which requires the inputs of the LNA to also be matched to that frequency range.

Typically, differential inputs are used in order to get better rejection against interfering signals. Single-ended blocker signals from the antenna port are attenuated by the RF-filters. In addition, in Frequency Division Duplex (FDD) systems, transmitter (TX) leakage from the TX port is attenuated by the duplex filter. Single-ended interfering signals at the antenna and transmitter ports tend to have high common-mode characteristics at the differential LNA input. However, only differential attenuation of the duplex and RF-filter is typically guaranteed according to the specification. These high-level common-mode blocker signals can desensitize the receiver front-end and create undesirable intermodulation products. Since the unmatched LNA input typically experiences up to 6 dB higher blocker signals compared to a matched case if the input impedance is relatively higher at the blocker frequency than at the wanted signal frequency, it is desirable to create a differential LNA topology with good common-mode matching. In addition, if the input matching is wide enough in order to give good matching for far away blocker signals such as TX, Wireless Local Area Network (WLAN) and Bluetooth™, the blocker signals are rejected already at the input. In addition, as mentioned above, the duplex filler performance is degraded in those frequencies if the input is not matched.

As a result, depending on the LNA structure, it may be necessary to utilize matching components external to the RFIC containing the LNA to appropriately set the input impedance and frequency range matching. However, these external matching components can be expensive, and in some cases it is preferable to use an LNA with internal matching capabilities to appropriately set its input impedance and frequency range matching.

Another measure of receiver performance is its sensitivity (reference sensitivity level), which measures the minimum detectable signal level at the receiver input. The signal quality of the received signal is typically determined by bit error rate or throughput. The sensitivity level S is determined by the equation:

$$S = -174 \text{ dBm/Hz} + 10 \log(BW) + SNR_{min} + NR \quad (1)$$

where $-174$ dBm/Hz is the available noise power density from an input source at a temperature of 290 K, BW is the channel bandwidth, $SNR_{min}$ is the required signal-to-noise ratio, and NF is the receiver noise figure. The $SNR_{min}$ depends on the targeted bit error rate and the modulation method used, for example.

The RF filter preceding the LNA that forms the first amplifying stage in a receiver may have significant insertion loss in some of the radio frequency bands within which the receiver is configured to operate. The insertion loss can cause the receiver to be less sensitive and have a higher noise figure for these radio frequency bands. Since the receiver sensitivity in these radio frequency bands is worse, the range between the transmitter and the receiver over which the receiver may be required to operate is reduced, thus making the cellular network design more challenging and more expensive. In addition, the size of the antenna connected to the receiver may be limited due to space constraints in devices such as mobile stations, thus restricting the performance of the antenna; this is exacerbated at lower frequencies, for example below 1 GHz, where the size of an antenna tends to become larger due to the longer wavelength. The receiver capability can therefore be degraded leading to decreased link performance.

To mitigate the above effects, the LNA noise figure should be as good as possible. However, achieving good noise performance without using external matching components prior to the LNA and with adequate current consumption is a challenging task. Additionally, as well as the expensive and size consuming external components, the cost of the RFIC containing the LNA must also be considered. To keep the semiconductor die area of the RFIC small, the number of on-chip inductors should be kept at a minimum, because high quality inductors require significant die area and their size does not downscale along with reductions in the features widths of integrated circuits.

From the above it can be seen that there are a number of different design factors to be considered when designing an LNA, and that accommodating some or all of these factors simultaneously can prove difficult. There is therefore a need to enhance LNA design by providing improved ways of accommodating various design factors.

SUMMARY OF THE INVENTION

In accordance with first embodiments, there is a configurable low noise amplifier circuit, the low noise amplifier circuit being configurable between one of:

a first topology in which the low noise amplifier circuit comprises a degeneration inductance stage whereby the low noise amplifier circuit operates as an inductively degenerated low noise amplifier; and a second topology in which the low noise amplifier circuit comprises a common-gate low noise amplifier stage whereby the low noise amplifier circuit operates as a common-gate low noise amplifier, wherein the second topology comprises one or more internal input impedance matching components and the first topology does not comprise the one or more internal input impedance matching components.

In accordance with second embodiments, there is a radio-frequency semiconductor integrated circuit comprising one or more configurable low noise amplifier circuits according to the first embodiments.

In accordance with third embodiments, there is a radio-frequency module comprising one or more radio-frequency filter circuits coupled to one or more configurable low noise amplifier circuits according to the first embodiments.

In accordance with fourth embodiments, there is a device comprising a configurable low noise amplifier circuit according to the first embodiments. The device may for example comprise a mobile telephone.

In accordance with fifth embodiments, there is a method of manufacturing a low noise amplifier circuit according to the first embodiments.

In accordance with sixth embodiments, there is a method of configuring a low noise amplifier circuit comprising applying one of a first set of one or more control signals to the circuit to configure the circuit in a first topology in which the low noise amplifier circuit comprises a degeneration inductance stage whereby the low noise amplifier circuit operates as an inductively degenerated low noise amplifier, or a second set of one or more control signals to the circuit to configure the circuit in a second topology in which the low noise amplifier circuit comprises a common-gate low noise amplifier stage whereby the low noise amplifier circuit operates as a common-gate low noise amplifier, wherein the second topology comprises one or more internal input impedance matching components and the first topology does not comprise the one or more internal input impedance matching components. When configured in the second topology, no external input impedance matching components are required.

Further features and advantages will become apparent from the following description of preferred embodiments, given by way of example only, which is made with reference to the accompanying drawings.

DETAILED DESCRIPTION OF THE INVENTION

Several LNA structures are known, each of these having certain benefits and drawbacks regarding their noise performance, overall cost, and input matching capabilities.

Known inductively degenerated common-source amplifier topologies typically do not provide any impedance matching internally within the LNA. This is because the size and quality of the passive components required to provide internal matching would make it technically and economically impractical to provide such components as part of the LNA. For example, high quality inductors require a larger silicon die area, and so would be impractical to include in an integrated LNA for a mobile device. This is especially true when then there are several LNAs inside a single RFIC. These topologies thus typically use external impedance matching components, i.e. components provided separately to an integrated circuit implementing the LNA, to match input impedance. For example, often an inductor is used as an external impedance matching component coupled to each of the differential inputs. One challenge is to achieve good noise performance without external matching components and with sufficiently low current consumption for mobile devices. The cost of a radio frequency receiver comprises the cost of a silicon area for receiver ICs, the cost of any external matching components and the cost of any printed wiring board (PWB) area. If there are multiple RFIC inputs, as for example is the case in wideband receivers, the count of the external matching components can become high thus increasing the expense of the radio frequency receiver. For example, some receivers may use multiple LNAs, each receiving a different band of frequencies; any external component costs and silicon area requirements are increased. In addition, the number of on-chip inductors should be kept at a minimum to reduce costs.

Figure 1:
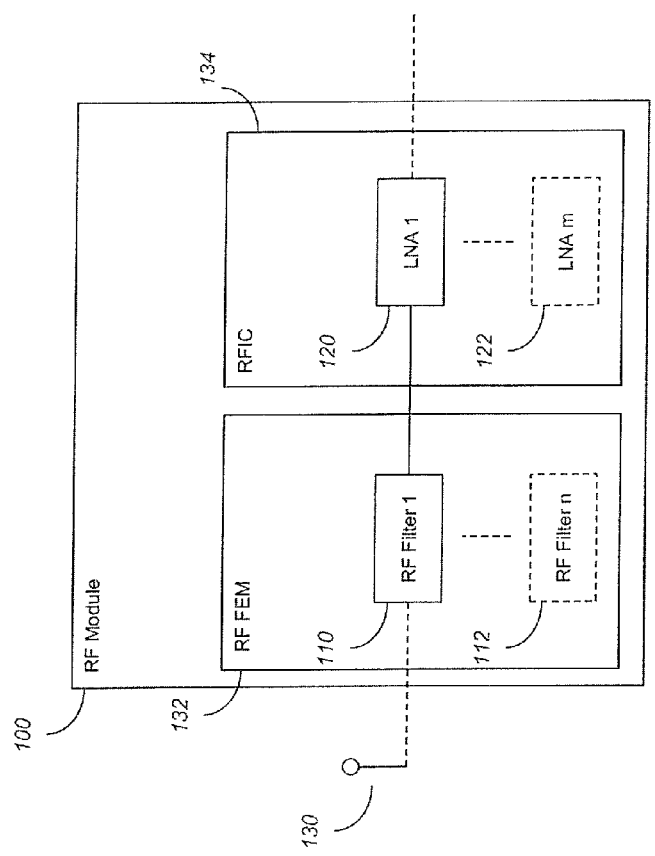
FIG. 1 illustrates a radio-frequency receiver according to the prior art.
Figure 2:
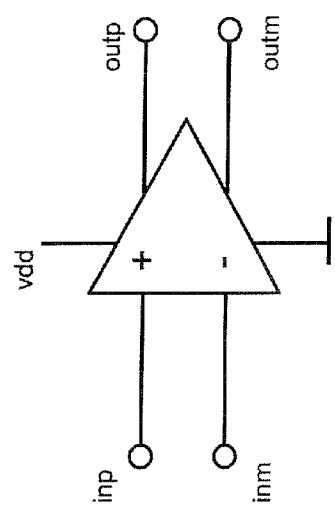
FIG. 2 illustrates a differential low noise amplifier according to the prior art.

FIG. 2 is a schematic diagram showing the inputs and outputs of a differential LNA. The LNA of FIG. 2 is an integrated differential low noise amplifier and as such has two inputs: inp and inm. For most differential signals, a signal p applied to inp will be 180 degrees out of phase with (i.e. of opposite phase to) a signal m applied to inm. The LNA of FIG. 2 has two outputs, one for positive components of the differential signal and one for positive components of the differential signal: outp and outm. In some implementations the two outputs may be connected to provide a single output. The LNA of FIG. 2 is powered by a voltage supply vdd and is connected to ground. The voltage supply supplies a DC voltage.

A differential amplifier typically has two parts, one for a first differential signal component, e.g. p, and one for a second differential signal component, e.g. m. These parts will be referred to herein as the positive or 'plus' side of the differential amplifier and the negative or 'minus' side of the differential amplifier. Each side of the differential amplifier will have a corresponding input and output, e.g. for a signal p, the p side will have input inp and output outp, likewise for a signal m, the m side will have input inm and output outp. In some embodiments the p and m sides of the differential amplifier are coupled at the outputs, for example via a configurable load.

Even though some embodiments will be described below with regard to a differential amplifier, the embodiments may also be applied to amplifiers for single-ended signals. In single-ended embodiments, only the features of one side of the differential amplifier may be supplied.

A known LNA topology is the inductively degenerated LNA topology, a detailed analysis of which has been given in, for example, in D. K. Shaeffer and T. H. Lee, "A 1.5-V, 1.5-GHz CMOS low noise amplifier." IEEE J. of Solid-State Circuits, vol. 32, no. 5, May 1997, pp. 745-759.

Figure 3:
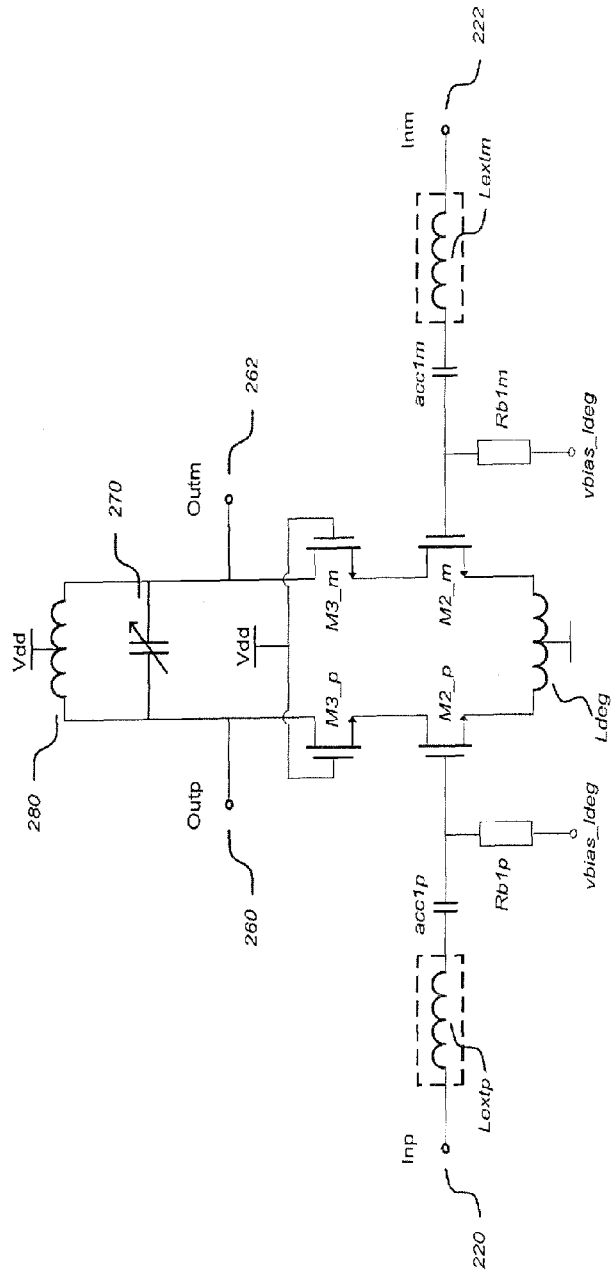
FIG. 3 is a circuit diagram of an inductively degenerated low noise amplifier circuit according to the prior art.

An exemplary inductively degenerated LNA circuit is depicted in FIG. 3. The LNA of FIG. 3 is a differential amplifier, where transistors M2_p and M3_p from the positive or 'plus' side of the differential amplifier, and transistors M2_m and M3_m from the negative or 'minus' side of the differential amplifier. The plus and minus sides of the differential amplifier are each arranged in a cascode configuration, where transistors M2_p and M2_m, each arranged in a common source configuration, form the input (or 'gain') transistors of the plus and minus sides, respectively, and transistors M3_p and M3_m form the cascode transistors (or 'current cascodes') of the plus and minus sides, respectively. In this case, each of transistors M2_p, M2_m, M3_p, M3_m is an enhancement mode n-channel metal-oxide-semiconductor field-effect transistor (MOSFET) (also referred to as 'NMOS').

The differential amplifier amplifies the difference between the two input signals inp, inm applied to its input terminals 220 and 222, where the signal applied to input terminal 222 is a signal having the same magnitude as the signal applied to input terminal 220 but being 180 degrees out of phase with that signal (i.e. the signals have opposite phase). The differential amplifier is capable of rejecting signal components common to both its input signals whilst amplifying the difference between the two signals. The degree to which the differential amplifier rejects signal components common to both its input signals whilst amplifying the difference between the two signals can be measured by the Common-Mode Rejection Ratio (CMRR) metric.

The gate terminal of input transistor M2_p on the plus side of the amplifier is connected to a bias voltage source vbias_1deg via a first bias resistor Rb1p and decoupling capacitor acc1p. The gate terminal of input transistor M2_p is also connected to an external matching component Lextp via decoupling capacitor acc1p. Input terminal 220 is connected to external matching component Lextp. External matching component Lextp is located on a separate circuit or device to the circuit containing the LNA of FIG. 3, i.e. matching component Lextp is 'off-chip' (denoted by dashed surrounding box in FIG. 3). In this case, matching component Lextp is an inductor.

Similarly on the minus side of the amplifier, the gate terminal of input transistor M2_m is connected to bias voltage source vbias_1deg via a second bias resistor Rb1m and decoupling capacitor acc1m. The gate terminal of input transistor M2_m is also connected to an external matching component Lextm via decoupling capacitor acc1m. Input terminal 222 is connected to external matching component Lextm. Again, matching component Lextm is located off-chip, and in this case is an inductor.

The gate terminals of input transistors M2_p and M2_m thus each form an input terminal of their respective input transistor. The source and drain terminals of input transistors M2_p and M2_m therefore form output terminals of the input transistors.

The source terminal of each of the two input transistors M2_p and M2_m is connected to a different respective terminal of an inductor Ldeg. Inductor Ldeg is a centre-tap differential inductor device with mutual coupling. Inductor Ldeg provides inductive degeneration of the source terminals of the two gain transistors M2_p and M2_m. The centre-tap terminal of inductor Ldeg is connected to ground.

The drain terminal of gain transistor M2_p on the plus side of the differential amplifier is connected to the source terminal of cascode transistor M3_p. Similarly, the drain terminal of gain transistor M2_m on the minus side of the differential amplifier is connected to the source terminal of cascode transistor M3_m.

The gate terminals of cascode transistors M3_p and M3_m are both connected to the circuit voltage supply Vdd (a DC voltage). Note that a gate terminal DC voltage can be set to a level other than Vdd, such that the drain voltages of gain transistors M2_p,m can be set to a desired level in order to increase the available voltage swing at the drain terminals of cascode transistors M3_p,m.

The drain terminals of cascode transistors M3_p and M3_m are connected to output terminals 260 and 262 respectively, where 260 is the output terminal of the plus side of the differential amplifier at which output signal outp is produced, and 262 is the output terminal of the minus side of the differential amplifier at which output signal outm is produced. The drain terminals of cascode transistors M3_p and M3_m are also each connected to the voltage supply Vdd via a configurable load; in this case the configurable load comprises an inductor 280 and variable capacitor 270 connected in parallel. Inductor 280 is a centre-tap differential inductor device and its centre-tap terminal is connected to voltage supply Vdd. The output terminals 260 and 262 of the LNA of FIG. 3 are thus connected to the configurable load.

The noise performance of the LNA topology depicted in FIG. 3 is typically dominated by the noise performance of input transistors M2_p and M2_m. The noise performance can be improved by optimizing the input matching network (for example including gain transistors M2_p and M2_m and external matching components Lextp and Lextm). In this topology, the input matching network preceding the input transistors provides passive voltage gain which can be measured as a ratio of the voltage swing observed at the gate to source terminal junction of the corresponding input transistor, e.g. M2_p, and the voltage swing at the LNA input. A high value for this ratio, known in this context as the Q-value of the input matching network, is beneficial in reducing the drain current noise of input transistor M2_p, but it increases the induced gate current noise of the input transistor. However, the inductively degenerated LNA requires several off-chip external matching components Lextp and Lextm, and thus tends to be relatively expensive.

A second known LNA topology is the common-gate LNA, a detailed analysis of which has been given in a journal publication entitled "A 4.5-mW 900-MHz CMOS Receiver for Wireless Paging," by Hooman Darabi and Asad A. Abidi published in IEEE Journal of Solid-State Circuits, VOL. 35, NO. 8, AUGUST 2000.

Figure 4:
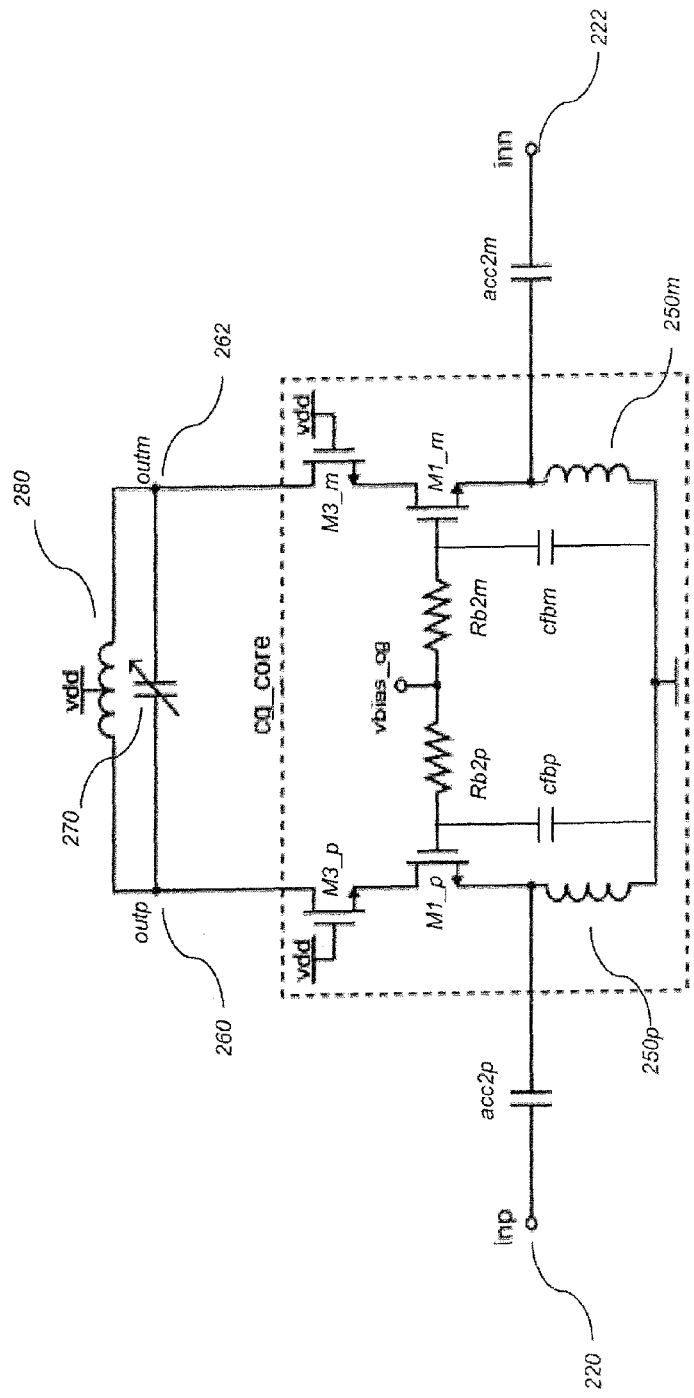
FIG. 4 is a circuit diagram of a common-gate low noise amplifier circuit according to the prior art.

An exemplary common-gate LNA circuit is depicted in FIG. 4. As with the inductively degenerated LNA of FIG. 3, the LNA of FIG. 4 is a differential amplifier, where transistors M1_p and M3_p from the positive or 'plus' side of the differential amplifier, and transistors M1_m and M3_m in form the negative or 'minus' side of the differential amplifier.

The common-gate LNA of FIG. 4 includes a common-gate LNA stage (labelled cg_core in FIG. 4) which includes input transistors M1_p,m which are provided with appropriate bias voltages from voltage source vbias_cg via bias resistors Rb2p,m. The common-gate LNA stage also includes cascode transistors M3_p,m and inductors 250p,m. The common-gate LNA stage of FIG. 4 also contains a capacitor cfbp,m between the gate of each input transistor and their output source terminals.

No external matching components Lextp and Lextm are provided in the common-gate LNA of FIG. 4. Input transistors M2_p and M2_m are thus directly connected to the input terminals 220, 222 respectively, via decoupling capacitors acc2p and acc2m.

Rather than requiring external matching components in order to match the impedance to which input terminals 220 and 222 are connected (where the impedance to be matched to is for example the output impedance of an RF filter preceding the LNA), the common-gate LNA of FIG. 4 is capable of matching the impedance connected to input terminals 220 and 222 internally within the LNA.

A common-gate LNA such as that depicted in FIG. 4 has a capability for internal input impedance matching because the impedance at the source of an input transistor is inversely proportional to the transconductance $g_m$. Typically, the single-ended termination impedance is 50 Ω, and therefore a transconductance of approximately 20 mS is required. A large impedance towards the signal ground is required in order to steer the signal into the source terminal of the input transistors which can be achieved with a current source connected to the respective source nodes. However, such a current source topology is not typically utilised due to associated poor noise performance and stacking of several transistors can lead to technology restrictions. Instead, a better noise performance is achieved by using an inductor at the source node of the input transistors M1_p,m as depicted in FIG. 4.

In the case of perfect impedance matching ($1/g_m = R_S$), the voltage gain of the common-gate low noise amplifier becomes a division of output load versus the source impedance, i.e. $Z_L/R_S$. Such an assumption is valid if the drain-to-source resistance $r_{ds}$ of the input transistors is much larger than the load resistance at the respective drain terminals. Since the voltage gain of the common-gate low noise amplifier is limited to load/source impedance ratios, it can be challenging to achieve a high voltage gain figure. Furthermore, the need for a high output impedance also requires special attention to be made to the interface design.

The minimum noise figure of a perfectly matched common-gate LNA typically presented in the prior art is:

$$NF = 10lg\left(1 + \frac{\gamma}{\alpha}\right) = 10lg\left(\frac{5}{3}\right) = 2.2 \text{ dB}$$

For short-channel devices, the noise parameter γ can be much greater than unity, and α can be much less than unity. In practice, an achievable noise figures tends to be around 3 dB or greater. This means that the noise figure is somewhat higher for a common-gate LNA compared to an inductively degenerated common-source LNA.

The input matching requirement prevents increasing the transconductance of the input transistors M1_p,m to lower the noise factor. However, the link between noise factor and input matching can be separated by introducing feedback from the load to the gate node for example as in the alternative common-gate LNA depicted in FIG. 5. This allows a decrease in noise figure with a larger transconductance. Further, the input impedance and frequency transfer function of the common-gate LNA can be adjusted simultaneously.

Figure 5:
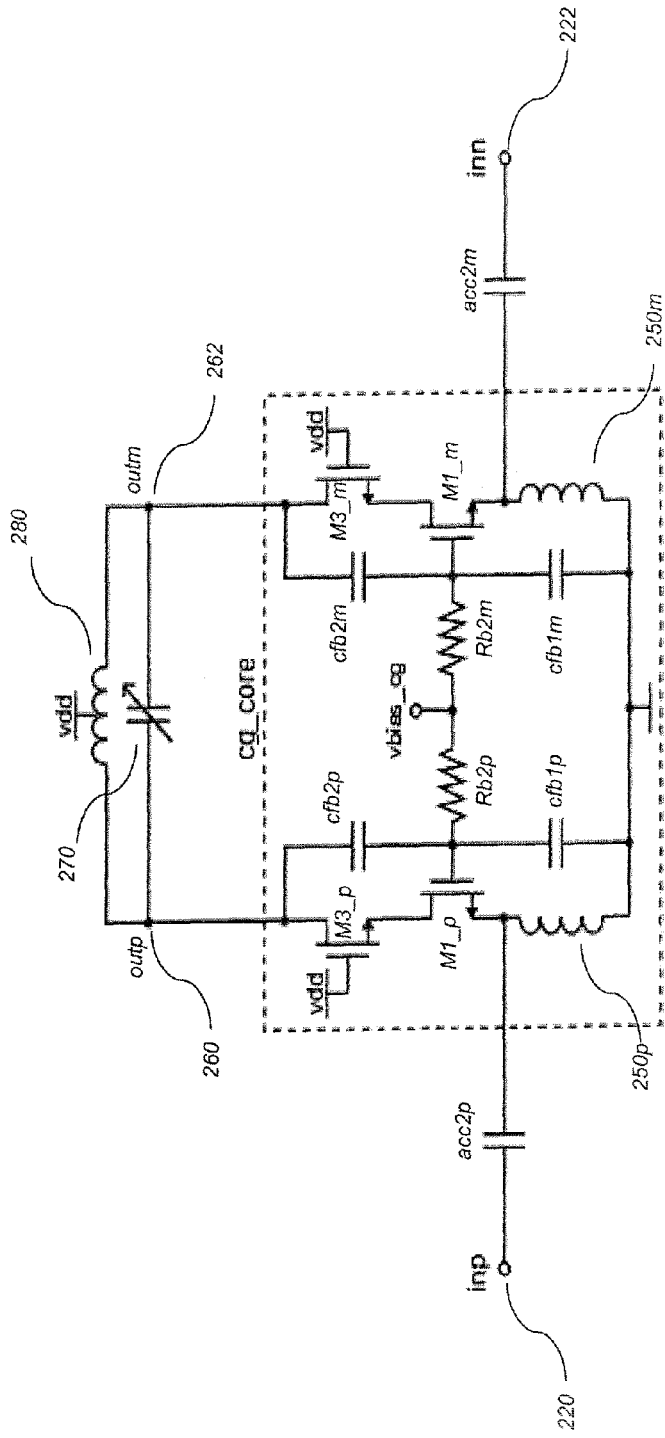
FIG. 5 is a circuit diagram of a common-gate low noise amplifier with feedback according to the prior art.

The circuit of FIG. 5 includes an alternative common-gate LNA stage cg_core to the circuit of FIG. 4. In addition to input transistors M1_p,m, cascode transistors M3_p,m and bias resistors Rb2p,m, the common-gate LNA stage of FIG. 5 contains first feedback loops between the gates of each input transistor and their output drain terminals via cascode transistors M3_p,m. In this case, each first feedback loop comprises a feedback capacitor cfb2p,m.

The common-gate LNA stage of FIG. 5 also contains second feedback loops between the gate of each input transistor and their output source terminals. In this case, each second feedback loop includes a feedback capacitor cfb1p,m. The second feedback loops are also coupled by inductors 250p,m.

Figure 6:
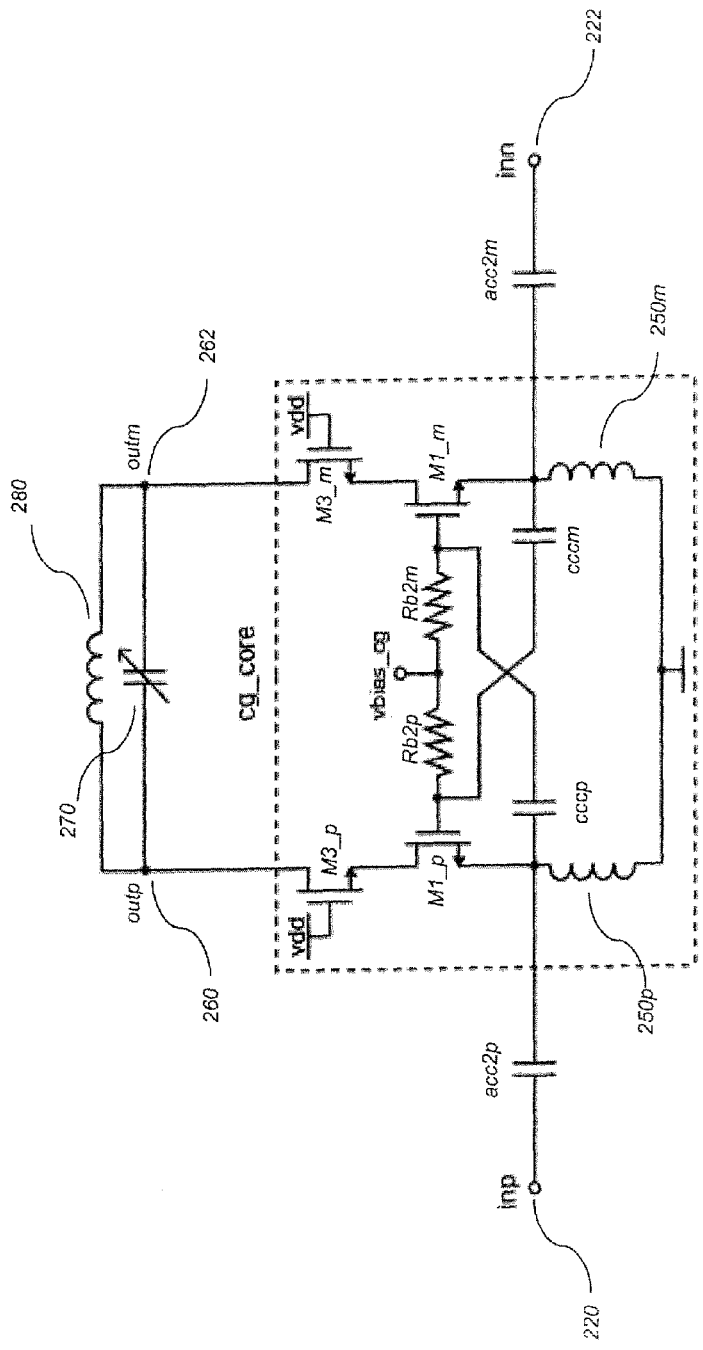
FIG. 6 is a circuit diagram of a common-gate low noise amplifier with cross-coupled inputs according to the prior art.

A further alternative common-gate LNA which requires less bias current to achieve the required input matching is depicted in FIG. 6. The common-gate LNA of FIG. 6 includes a further alternative common-gate LNA stage cg_core where inverting gain from the source to gate terminals of the input transistors M1_p,m is applied. In this case, capacitor cross-coupling suitable for differential input configurations is applied via cross-coupling capacitors cccp, cccm. The measured noise figure of a transconductance-boosted common-gate LNA using capacitor cross-coupling as per FIG. 6 is approximately 3.0 dB. Thus, such cross-coupling does not improve the noise figure compared to the common-gate LNAs of FIGS. 4 and 5, but requires less bias current to achieve the required input matching.

In summary, a common-gate LNA can provide wideband matching without external matching components. In addition, a common-gate LNA offers good linearity. Furthermore, if two independent source inductors are used, good input matching is also achieved in common-mode which results in good common-mode linearity as well. Compared to the inductively degenerated LNA of FIG. 3, a common-gate LNA has poorer noise performance and, depending on the application, it can require special attention in relation to interface design.

Embodiments relate to an LNA circuit that can be configured between one of a first topology in which the low noise amplifier circuit comprises a degeneration inductance stage such that the low noise amplifier circuit operates as an inductively degenerated low noise amplifier, and a second topology in which the low noise amplifier circuit comprises a common-gate low noise amplifier stage such that the low noise amplifier circuit operates as a common-gate low noise amplifier. In the first topology, one or more external matching components are used in conjunction with the LNA for input impedance matching purposes. In the second topology, input impedance matching is carried out using components internal to the LNA topology; no external matching components are required in the second topology. Input impedance matching may for example involve matching to the output impedance of an RF filter connected to one or more inputs of the LNA.

Figure 7:
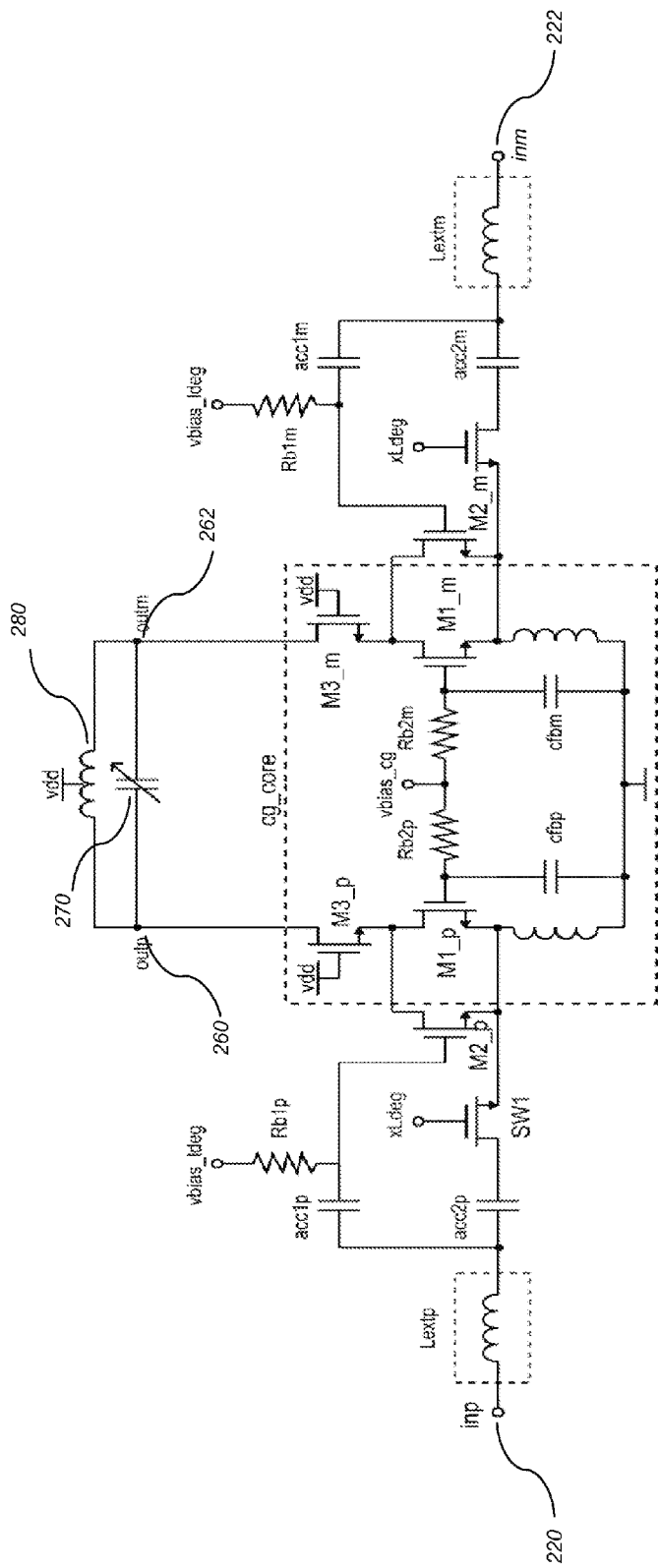
FIG. 7 is a circuit diagram of a configurable low noise amplifier according to embodiments.

An exemplary configurable LNA circuit according to the invention is illustrated in FIG. 7. As with the LNAs of FIGS. 3 to 6, the exemplary LNA of FIG. 7 is a differential amplifier, where transistors M1_p, M2_p and M3_p form the positive or 'plus' side of the differential amplifier, and transistors M1_m, M2_m and M3_m from the negative or 'minus' side of the differential amplifier.

The exemplary configurable LNA circuit of FIG. 7 contains a common-gate LNA stage (labelled cg_core) as per the common-gate LNA stage of the circuit of FIG. 4. In some embodiments, the common-gate LNA stage of the configurable LNA circuit is replaced by the common-gate LNA stage (labelled cg_core) of the circuit of FIG. 5 or that of FIG. 6.

The topology of the configurable LNA of FIG. 7 necessarily contains some similar features to both the inductively degenerated LNA of FIG. 3 and the common-gate LNA of FIG. 4; however, there are several important differences which include the following:

Firstly, the configurable LNA of FIG. 7 contains a switching arrangement for configuring the LNA between one of the first topology and the second topology. The switching arrangement contains a topology switching function, in this case switching transistors SW1_p,m connected between an output of the degeneration inductance stage and an input of the configurable LNA. In this case, the source terminals of SW1_p,m are connected to the source terminals of the input transistors M1_p,m of the common-gate LNA stage and the drain terminals of SW1_p,m are connected to decoupling capacitors acc2p,m. The source terminals of switching transistors SW1_p,m are also connected to the source terminals of the input transistors M2_p,m of the inductively degenerated LNA stage. The gate terminals of switching transistors SW1_p,m are connected to a configuration control signal terminal, for example as labelled xLdeg in FIG. 7.

Secondly, instead of including both degeneration inductors in each differential circuit as per the inductively degenerated LNA of FIG. 3 and also inductors at the source of the input transistors M1_p,m in both differential circuits as per the common-gate LNA stage of FIG. 4, the configurable LNA of FIG. 7 only comprises inductors 250p,m. These inductors are shared between the first and the second topologies and usefully employed when the configurable LNA is configured in either topology. Such component re-use helps reduce costs and die area.

By applying appropriate configuration control signals to configuration control terminals xLdeg, switching transistors SW1_p,m can be switched between an open state, whereby the configurable LNA of FIG. 7 is configured in the first topology, and a closed state, whereby the configurable LNA of FIG. 7 is configured in the second topology.

The configurable LNA can be configured according to the desired use case. Sensitivity can be improved in the first, inductively degenerated configuration if required but at the cost of a requirement for external matching components. However, since in the second, common-gate configuration the configurable LNA can be matched without external components, a cost-efficient solution is provided. The second, common-gate configuration also provides better linearity than the first, inductively degenerated configuration. Thus, embodiments provide the possibility to trade-off between price and performance.

The first and second topologies that the configurable LNA can be configured between using the topology switching function will now be described in more detail.

When in an open state, a switching transistor provides a high resistance between its drain and source terminals which effectively disconnects (or 'open-circuits') the drain and source terminals. A switching transistor may be placed in the open state by applying an appropriate control signal to the respective configuration control signal terminal such that the voltage between the gate terminal and the source terminal (i.e. the voltage $V_{gs}$) of the switching transistor is less (or approximately less) than the threshold voltage (i.e. the voltage $V_t$) of the switching transistor, i.e. a switching transistor may thus be described as being in cutoff mode. A configuration control signal for configuring a switching transistor into an open state may for example comprise a digital '0' signal (such as a signal comprising a first voltage level).

When in a closed state, a switching transistor provides a low resistance between its drain and source terminals which effectively connects (or 'short-circuits') the drain and source terminals. A switching transistor can be placed in the closed state by applying a configuration control signal to its control signal terminal such that the voltage between the gate terminal and the source terminal (i.e. the voltage $V_{gs}$) of the switching transistors is greater than the threshold voltage (i.e. the voltage $V_t$) of the switching transistor, i.e. a switching transistor may thus be described as being in triode mode. A configuration control signal for configuring a switching transistor into a closed state may for example comprise a digital '1' (such as a signal comprising a second voltage level)

In the first topology, switching transistors SW1_p,m are configured to an open state.

The switching arrangement also comprises a first bias voltage switching function adapted to set the bias voltage vbias__1deg to either a relatively high or a relatively low bias voltage. The configurable low noise amplifier circuit is configurable in the first topology by using the first bias voltage switching function to set the bias voltage vbias__1deg to a relatively high bias voltage. Applying a relatively high bias voltage to the input transistors M2_p,m of the inductively degenerated LNA stage biases the M2_p,m transistors to an open state. What constitutes a relatively high bias voltage depends on the transistor technology used. Typically, a relatively high bias voltage comprises a voltage of around one third to one half of the supply voltage, although voltages outside this could be employed. In embodiments, the supply voltage is 1.25V and a relatively high bias voltage comprises 450-500 mV.

The switching arrangement also comprises a second bias voltage switching function adapted to set the bias voltage vbias_cg to either a relatively high or a relatively low bias voltage. The configurable low noise amplifier circuit is configurable in the first topology by using the second bias voltage switching function to set the bias voltage vbias_cg to a relatively low bias voltage. Applying a relatively low bias voltage to the input transistors M1_p,m of the common-gate LNA stage biases the M1_p,m transistors in a closed state. A relatively low bias voltage may for example comprise a zero bias voltage.

By configuring switching transistor SW1_p,m to an open state and biasing input transistors M1_p,m of the common-gate LNA stage in a closed state, the source terminals of input transistors M2_p,m of the inductively degenerated stage are connected via inductors 250p,m, whose centre-tap is connected to ground. Inductors 250p,m therefore provide inductive degeneration of the source terminals of input transistors M2_p, as in the inductively degenerated LNA of FIG. 3.

The configurable LNA thus operates as an inductively degenerated LNA when switching transistors SW1_p,m are switched to an open state, i.e. when the configurable LNA is configured in the first topology.

Therefore, when configured in the first topology, the configurable LNA does not provide internal input impedance matching, for example matching to the output impedance of a preceding RF filter connected to input terminals 220 and 222. As a result, the input impedance of the configurable LNA of FIG. 7 can be matched, for example to a preceding RF filter, by connecting external impedance matching components. The external matching components may for example comprise external matching components Lextp and Lextm as depicted in FIG. 7 (and similarly as shown in the inductively degenerated LNA of FIG. 3), which are connected in-between decoupling capacitors acc1p,m and input terminals 220 and 222 respectively.

The first topology of the configurable LNA of FIG. 7 thus provides the benefits of the inductively degenerated LNA of FIG. 3, i.e. relatively low noise figure, but requires the use of external matching components in order to provide input impedance matching.

In the second topology, switching transistors SW1_p,m are configured to a closed state.

The configurable low noise amplifier circuit is configurable in the second topology by using the first bias voltage switching function to set the bias voltage vbias_1deg to a relatively low bias voltage. Applying a relatively low bias voltage to the input transistors M2_p,m of the inductively degenerated LNA stage biases the M2_p,m transistors to a closed state.

The configurable low noise amplifier circuit is configurable in the second topology by using the second bias voltage switching function to set the bias voltage vbias_cg to a relatively high bias voltage. Applying a relatively high bias voltage to the input transistors M1_p,m of the common-gate LNA stage biases the M1_p,m transistors in an open state.

By configuring switching transistor SW1_p,m to a closed state and biasing input transistors M1_p,m of the common-gate LNA stage in an open state, the source terminals of input transistors M1_p,m of the common-gate LNA stage are connected via inductors 250p,m, which are connected to ground. Inductors 250p,m connected to the source terminals of input transistors M1_p,m source are high impedance at the operating frequency and work as the DC-current path to ground for the second topology.

Inductors 250p,m remain in-circuit in both the first topology and the second topology such that embodiments use the area of an expensive (in terms of area) integrated inductor 250 for two different purposes. The same integrated inductor 250 is used as a degeneration inductor in the inductively degenerated topology and as a DC feed inductor in the common-gate LNA topology. The use of a single inductor 250 in both topologies avoids one expensive on-chip component being required for one topology and another expensive on-chip component being required for the other topology.

The configurable LNA of FIG. 7 thus provides an LNA that can be configured according to the desired use case or design requirements.

The LNA can be configured in the first topology if a more sensitive LNA with a better noise figure is required, at the cost of a need for external matching components, e.g. Lextp and Lextm, in order to provide impedance matching for the inputs of the configurable LNA. Alternatively, the LNA can be configured in the second topology in order to provide a more cost effective solution with better linearity. Note that the external input impedance matching components which are included in FIG. 7 are not included in the second topology.

The configurable LNA may be configured by its manufacturer, or by a third party installing the configurable LNA, for example in a device or module thereof; this may involve a method of configuring the LNA that comprises applying either a first set of one or more control signals to the LNA to configure it in the first topology or a second set of one or more control signals to the LNA to configure it in the second topology. A set of control signals may for example be applied to one or more of the switching transistors and bias voltage switching functions.

The configurable LNA of FIG. 7 can be implemented in a radio-frequency semiconductor integrated circuit (RFIC). Such an RFIC may be included in an RF module comprising an RF filter located in an RF Front End Module preceding the LNA. The RFIC may comprise input and output pins that may be used to connect external matching components between the configurable LNA and the RF filter. An RFIC could alternatively comprise one or more RF filters connected to one or more configurable LNAs.

The configurable LNA of FIG. 7 can be incorporated in a number of different devices. Such a device could comprise a user equipment such as a mobile station, personal digital assistant or cellular telephony device etc.; the configurable LNA may for example be included in a receiver of such a user equipment. Further, such a device could comprise a modem device to be attached to a user equipment, for example a Universal Serial Bus (USB modem). Still further, such a device could comprise a communication module such as a Machine-to-Machine (M2M) module which can be inserted into another device such as a laptop computer or other device with communication capability (for example a vending machine). Yet, still further, such a device could comprise a chipset which may include radio and baseband parts.

In embodiments, the configurable low noise amplifier circuit comprises a common output terminal at which the output of the configurable low noise amplifier circuit is provided when configured in either said first topology or said second topology. For example, in the case of a non-differential circuit such as only the positive side of the configurable low noise amplifier of FIG. 7 being employed, the output of the circuit when configured in the first topology is produced at output terminal 260 and the output of the circuit when configured in the second topology is also produced at output terminal 260. Such re-use of a single output terminal for both topologies provides a lower cost solution both for the configurable LNA itself and other components connecting to it than a solution requiring multiple output terminals. Similarly, a single, common, pair of output terminals can be employed for the case of a differential circuit, rather than multiple pairs of output terminals for different configurations.

In embodiments described above, reference is made to the input and outputs of a MOSFET transistor. It should be understood that input refers to the gate and output refers to either the source or drain.

The above embodiments are to be understood as illustrative examples of the invention. Further embodiments of the invention are envisaged, some examples of which follow here.

In a first alternative arrangement, cascode transistors M3_p,m are not included in the configurable LNA circuit of FIG. 7. In such an arrangement, on the plus side of the differential amplifier, the drain terminals of input transistors M1_p,m and M2_p,m are connected to output terminal 260 of the configurable LNA and to the configurable load (e.g. inductor 280 and variable capacitor 270) that is connected to the voltage supply Vdd. Similarly, on the minus side of the differential amplifier, the drain terminals of input transistors M1_p,m and M2_p,m are connected to output terminal 262 of the configurable LNA and to the configurable load that is connected to the voltage supply Vdd. The omission of the cascode transistors M13_p,m may degrade the input-output isolation of the invention and worsen the Miller effect of the configurable LNA; however such an arrangement still benefits from the other advantages of the configurable LNA of FIG. 7 described above.

In a second alternative arrangement, only one sidle of the differential amplifier is included in the configurable LNA circuit of FIG. 7, for example either the plus side or the minus side. In such an arrangement only one input terminal, e.g. 220, and only one output terminal, e.g. 260, are included in the configurable LNA circuit. Similarly, only one switching transistor is employed, for example SW1_p. This arrangement thus does not comprise a differential amplifier and does not benefit from the common-mode rejection capabilities of a differential amplifier; however such an arrangement still benefits from the other advantages of the configurable LNA of FIG. 7 described above.

Figure 8:
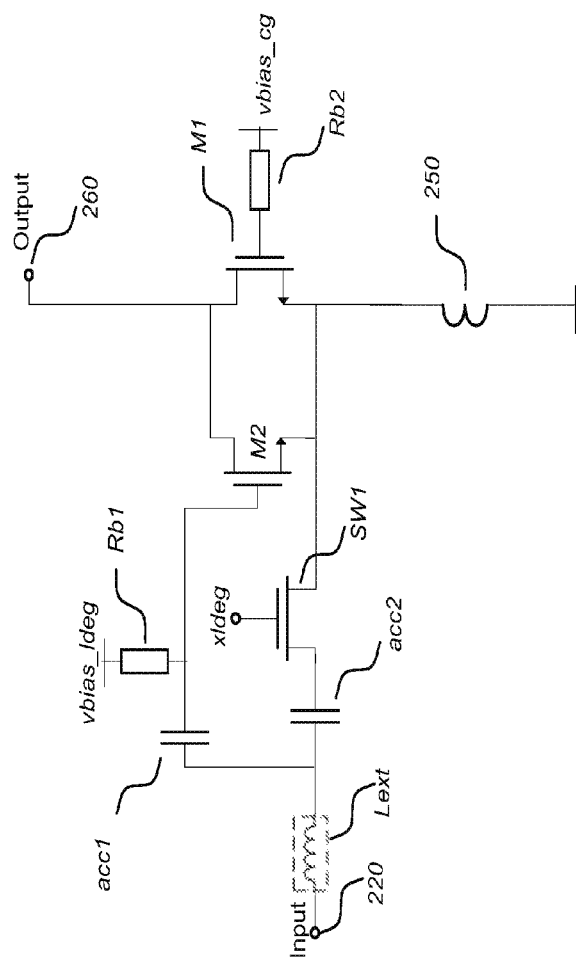
FIG. 8 is a circuit diagram of a configurable low noise amplifier according to embodiments.

An exemplary configurable LNA circuit combining the first alternative arrangement above where the cascode transistors are omitted, and the second alternative arrangement above where only one side of the differential amplifier of the configurable LNA circuit of FIG. 7 is included, is illustrated in FIG. 8. This arrangement still benefits from the many of the advantages of the configurable LNA of FIG. 7 described above.

Different types of topology switching functions may be used with any of the embodiments described above. For example, as opposed to n-type enhancement mode MOSFETs, p-type and/or depletion mode MOSFETs may be used. In another example, bipolar junction transistors may be used.

In further alternative embodiments, topology switching functions other than switching transistors can be employed, for example mechanical switches which can be physically switched to configure the configurable LNA in the desired topology. In another further alternative embodiment, inductor 250 may comprise a centre-tap inductor whose centre tap is connected to ground.

De-coupling capacitors acc1p,m and acc2p,m may be omitted from any of the embodiments described above.

The configurable load, e.g. resonator load formed by inductor 280 and variable capacitor 270, may be removed from the circuit or alternatively replaced with another impedance such as a non-resonator load, wideband load, active load etc.

In a yet further alternative embodiment, the configuration control signals applied to configuration control terminals xLdeg may be provided by an RFIC containing the configurable LNA of FIG. 7. For example, one or more topology switching functions may be used to connect configuration control terminals xLdeg to an appropriate voltage supply (e.g. Vdd for one configuration and ground for another configuration) of the RFIC, in order to configure the LNA in either the first topology or the second topology. In another example, one or more non-volatile memory devices may be configured to provide the configuration control signals, for example the output of a static random access memory (SRAM) device, flash memory device or Electrically Erasable Programmable Read-Only Memory (EEPROM) device may provide the configuration control signals. Such a non-volatile memory device could be externally programmed to store appropriate data (e.g. a '0' bit or a '1' bit) in order to allow the memory device to provide configuration control signals that configure the LNA in either the first topology or the second topology. The method of configuring the LNA may in this case include applying a set of control signals to the LNA by programming the above non-volatile memory device appropriately.

Figure 9:
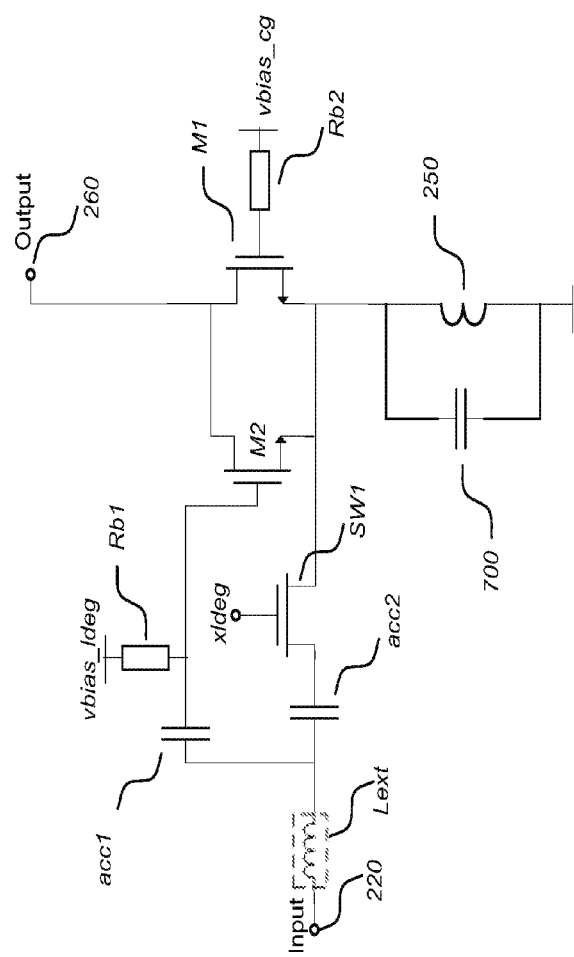
FIG. 9 is a circuit diagram of a configurable low noise amplifier according to embodiments.

Another alternative embodiment involves adding, in addition to the configurable degeneration inductance, a configurable capacitor at the source terminal of the input transistor(s) of the configurable LNA, for example as per capacitor 700 shown in the configurable LNA circuit of FIG. 9. This allows setting of the resonator frequency at the source terminal to a desired frequency. In the common-gate LNA topology, the inductor should be high impedance at the operating frequency and therefore it should be of a relatively large value. For the inductively degenerated LNA topology, an inductor of a relatively smaller value is usually preferred in order to obtain a better noise figure and higher gain. The capacitor 700 in the common-gate LNA topology allows the inductor to be of a smaller value, thus assisting with optimisation of the inductively degenerated LNA topology.

In embodiments, there is provided a configurable low noise amplifier circuit, the low noise amplifier circuit being configurable between one of:
a first topology in which the low noise amplifier circuit comprises a degeneration inductance stage whereby the low noise amplifier circuit operates as an inductively degenerated low noise amplifier; and
a second topology in which the low noise amplifier circuit comprises a common-gate low noise amplifier stage whereby the low noise amplifier circuit operates as a common-gate low noise amplifier,
wherein the second topology comprises one or more internal input impedance matching components and the first topology does not comprise the one or more internal input impedance matching components.

Hence, provision of either inductively degenerated low noise amplifier functionality or common-gate low noise amplifier functionality via a single low noise amplifier circuit is provided. Only a single instance of some components common to both of the topologies is required and such component re-use helps to reduce the cost and die area. For example, an inductor tends to be a large component and the embodiments advantageously re-use an inductor in both the first and second topologies. The first topology requires one or more external components for input impedance matching, whereas the second topology includes one or more internal input impedance matching components within the topology.

In some embodiments, the circuit comprises a switching arrangement, the circuit being configurable between one of the first topology and the second topology via the switching arrangement. Hence, the circuit can be configured in the first or second topology according to the desired performance of the circuit.

In some embodiments, the switching arrangement comprises a topology switching function connected between an output of the degeneration inductance stage and an input of the configurable low noise amplifier circuit. The circuit is configurable in the first topology by configuring the topology switching function in an open state, and the circuit is configurable in the second topology by configuring the topology switching function in a closed state. Hence, efficient configuration of the LNA circuit between the first and second topologies is provided.

In some embodiments, the topology switching function comprises a switching transistor, the switching transistor is configurable in the open state via input of an open state configuration control signal to its input terminal, and the switching transistor is configurable in the closed state via input of a closed state configuration control signal to its input terminal. Hence, the topology of the LNA circuit can be conveniently configured by applying appropriate control signals, for example digital control signals, to a number of switching transistors within the LNA circuit.

In some embodiments, the degeneration inductance stage comprises a first input transistor coupled to the input of the configurable low noise amplifier circuit and a degeneration inductor connected between a first output of the first input transistor and ground. Hence, the invention provides an LNA topology with associated good noise figure and sensitivity performance. Input impedance matching is provided via the degeneration inductance and one or more external matching components.

In some embodiments, the degeneration inductance stage comprises a first bias resistor coupled to the input of the first input transistor and a first bias voltage. Hence, the degeneration inductance stage can be set in an appropriate operating mode.

In some embodiments, the degeneration inductance stage comprises a first decoupling capacitor connected between the input of the configurable low noise amplifier circuit and the input of the first input transistor. Hence, DC decoupling and AC coupling to the first input transistor is provided.

In some embodiments, the common-gate low noise amplifier stage comprises a second input transistor and an inductor, and the inductor is coupled to a first output of the second input transistor and ground. In this topology, improved linearity performance at the expense of noise figure is achieved. The transconductance of the second input transistor determines the input impedance and the inductor provides a high impedance towards ground. There is therefore no requirement for impedance matching using external matching components.

In some embodiments, the common-gate low noise amplifier stage comprises one or more feedback loops from the input of the second input transistor to an output of the second input transistor. In some embodiments, one of the one or more feedback loops comprises the inductor of the common-gate amplifier stage. In some embodiments, at least one of the one or more feedback loops comprises a feedback capacitor. Hence, a separation between noise factor and input matching can be achieved allowing a larger transconductance with decreased noise figure.

In some embodiments, the common-gate low noise amplifier stage comprises a second bias resistor coupled to the input of the second input transistor and a second bias voltage. Hence, the common-gate low noise amplifier stage can be set in an appropriate operating mode.

In some embodiments, the common-gate low noise amplifier stage comprises a second decoupling capacitor connected between the input of the configurable low noise amplifier circuit and the input of the second input transistor. Hence, DC decoupling and AC coupling to the second input transistor is provided.

In some embodiments, the inductor of the common-gate amplifier stage comprises the degeneration inductor of the degeneration inductance stage, whereby the inductor remains in the circuit in both the first topology and the second topology. Hence, a single inductor can be employed in both topologies thus helping to reduce cost and die area.

In some embodiments, the switching arrangement comprises a first bias voltage switching function adapted to set the first bias voltage to either a relatively high or a relatively low bias voltage, and the configurable low noise amplifier circuit is configurable in the first topology setting the first bias voltage to a relatively high bias voltage and configurable in the second topology by setting the first bias voltage to a relatively low bias voltage. Hence, the first input transistor can be opened in the first topology and closed in the second topology.

In some embodiments, the switching arrangement comprises a second bias voltage switching function adapted to set the second bias voltage to either a relatively high or a relatively low bias voltage, and the configurable low noise amplifier circuit is configurable in the first topology by setting the second bias voltage to a relatively low bias voltage and configurable in the second topology by setting the first bias voltage to a relatively high bias voltage. Hence, the second input transistor can be opened in the second topology and closed in the first topology.

In some embodiments, the circuit comprises a common output terminal at which the output of the configurable low noise amplifier circuit is provided when configured in either the first topology or the second topology. Re-use of a single output terminal for both topologies provides a lower cost solution for the configurable LNA and connections to components interfacing with the configurable LNA are simplified.

In some embodiments, the configurable low noise amplifier circuit comprises one or more current cascodes located before the output of the low noise amplifier circuit. The current cascodes allow a current signal to be buffered before being output by the configurable low noise amplifier. One or more current cascodes enable gain control to be added to the configurable low noise amplifier, while the parasitic capacitance seen at the LNA output is reduced.

In some embodiments, the circuit comprises a configurable load connected to the output of the circuit. The configurable load may for example comprise an LC (inductor/capacitor) resonator load.

In some embodiments, the configurable low noise amplifier circuit comprises a differential amplifier, the stages forming one side of the differential amplifier. Certain embodiments are particularly suited to implementations that use differential signals, such as low noise amplifiers in radio-frequency communications systems.

In some embodiments, the input of one side of the common-gate low noise amplifier differential pair is cross-coupled to an output of the other side of the common-gate low noise amplifier differential pair via a cross-coupling capacitor. Hence, input impedance matching is provided in the second topology with decreased current consumption.

In some embodiments, the degeneration inductor comprises a centre-tap differential degeneration inductor connected between respective outputs of each differential circuit and ground.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A configurable low noise amplifier circuit, said low noise amplifier circuit being configurable between one of:
  a first topology in which said low noise amplifier circuit comprises a degeneration inductance stage whereby said low noise amplifier circuit operates as an inductively degenerated low noise amplifier; and
  a second topology in which said low noise amplifier circuit comprises a common-gate low noise amplifier stage whereby said low noise amplifier circuit operates as a common-gate low noise amplifier,
  wherein said second topology comprises one or more internal input impedance matching components and said first topology does not comprise said one or more internal input impedance matching components,
  wherein said circuit comprises a switching arrangement, said circuit being configurable between one of said first topology and said second topology via said switching arrangement, said switching arrangement comprising a topology switching means connected between an output of said degeneration inductance stage and an input of said configurable low noise amplifier circuit,
  wherein said circuit is configurable in said first topology by configuring said topology switching means in an open state, and wherein said circuit is configurable in said second topology by configuring said topology switching means in a closed state.

2. A configurable low noise amplifier circuit according to claim 1, wherein said topology switching means comprises a switching transistor,
   wherein said switching transistor is configurable in said open state via input of an open state configuration control signal to its input terminal, and
   wherein said switching transistor is configurable in said closed state via input of a closed state configuration control signal to its input terminal.

3. A configurable low noise amplifier circuit according to claim 1, wherein said degeneration inductance stage comprises a first input transistor coupled to the input of said configurable low noise amplifier circuit and a degeneration inductor connected between a first output of said first input transistor and ground.

4. A configurable low noise amplifier circuit according to claim 3, wherein said degeneration inductance stage comprises a first bias resistor coupled to the input of said first input transistor and a first bias voltage.

5. A configurable low noise amplifier circuit according to claim 3, wherein said degeneration inductance stage comprises a first decoupling capacitor connected between the input of said configurable low noise amplifier circuit and the input of said first input transistor.

6. A configurable low noise amplifier circuit according to claim 1, wherein said common-gate low noise amplifier stage comprises a second input transistor and an inductor, and
   wherein said inductor is coupled to a first output of said second input transistor and ground.

7. A configurable low noise amplifier circuit according to claim 6, wherein said common-gate low noise amplifier stage comprises a second bias resistor coupled to the input of said second input transistor and a second bias voltage.

8. A configurable low noise amplifier circuit according to claim 3, wherein an inductor of said common-gate amplifier stage comprises said degeneration inductor of said degeneration inductance stage, whereby said inductor remains in said circuit in both said first topology and said second topology.

9. A configurable low noise amplifier circuit according to claim 4, wherein said switching arrangement comprises:
   a first bias voltage switching means adapted to set said first bias voltage to either a relatively high or a relatively low bias voltage,
   wherein said configurable low noise amplifier circuit is configurable in said first topology by setting said first bias voltage to a relatively high bias voltage and configurable in said second topology by setting said first bias voltage to a relatively low bias voltage.

10. A configurable low noise amplifier circuit according to claim 7, wherein said switching arrangement comprises:
    a second bias voltage switching means adapted to set said second bias voltage to either a relatively high or a relatively low bias voltage,
    wherein said configurable low noise amplifier circuit is configurable in said first topology by setting said second bias voltage to a relatively low bias voltage and configurable in said second topology by setting said second bias voltage to a relatively high bias voltage.

11. A configurable low noise amplifier circuit according to claim 1, wherein said circuit comprises a common output terminal at which the output of said configurable low noise amplifier circuit is provided when configured in either said first topology or said second topology.

12. A configurable low noise amplifier circuit according to claim 1, said configurable low noise amplifier circuit comprising one or more current cascodes located before the output of the low noise amplifier circuit.

13. A configurable low noise amplifier circuit according to claim 1, said circuit comprising a configurable load connected to the output of said circuit.

14. A configurable low noise amplifier circuit according to claim 1, wherein said configurable low noise amplifier circuit comprises a differential amplifier, said stages forming one side of said differential amplifier.

15. A radio-frequency semiconductor integrated circuit comprising one or more configurable low noise amplifier circuits according to claim 1.

16. A radio-frequency module comprising one or more radio-frequency filter circuits coupled to one or more configurable low noise amplifier circuits according to claim 1.

17. A device comprising a configurable low noise amplifier circuit according to claim 1.

18. A method of manufacturing a low noise amplifier circuit according to claim 1.

19. A method of configuring a low noise amplifier circuit comprising applying one of:
    a first set of one or more control signals to said circuit to configure said circuit in a first topology in which said low noise amplifier circuit comprises a degeneration inductance stage whereby said low noise amplifier circuit operates as an inductively degenerated low noise amplifier; or
    a second set of one or more control signals to said circuit to configure said circuit in a second topology in which said low noise amplifier circuit comprises a common-gate low noise amplifier stage whereby said low noise amplifier circuit operates as a common-gate low noise amplifier,
    wherein said second topology comprises one or more internal input impedance matching components and said first topology does not comprise said one or more internal input impedance matching components,
    wherein said circuit comprises a switching arrangement, said circuit being configurable between one of said first topology and said second topology via said switching arrangement, said switching arrangement comprising a topology switching means connected between an output of said degeneration inductance stage and an input of said configurable low noise amplifier circuit,
    wherein said circuit is configurable in said first topology by configuring said topology switching means in an open state, and
    wherein said circuit is configurable in said second topology by configuring said topology switching means in a closed state.

* * * * *

UNITED STATES PATENT AND TRADEMARK OFFICE
CERTIFICATE OF CORRECTION

| | | |
|---|---|---|
| PATENT NO. | : 8,294,515 B1 | |
| APPLICATION NO. | : 13/556552 | |
| DATED | : October 23, 2012 | |
| INVENTOR(S) | : Jonne Juhani Riekki et al. | |

It is certified that error appears in the above-identified patent and that said Letters Patent is hereby corrected as shown below:

Title Page, Item 56 under the heading of "References Cited,"

please add the following U.S. Patent Document:

-- 6,768,377 B2   7/2004   Macedo. --

Signed and Sealed this
First Day of January, 2013

David J. Kappos
*Director of the United States Patent and Trademark Office*